US006992359B2

(12) United States Patent
Nguyen et al.

(10) Patent No.: US 6,992,359 B2
(45) Date of Patent: Jan. 31, 2006

(54) SPIN TRANSFER MAGNETIC ELEMENT WITH FREE LAYERS HAVING HIGH PERPENDICULAR ANISOTROPY AND IN-PLANE EQUILIBRIUM MAGNETIZATION

(75) Inventors: Paul P. Nguyen, San Jose, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 10/789,334

(22) Filed: Feb. 26, 2004

(65) Prior Publication Data
US 2005/0189574 A1    Sep. 1, 2005

(51) Int. Cl.
H01L 43/00    (2006.01)
(52) U.S. Cl. .................... 257/421; 257/295; 365/97; 365/158; 438/3
(58) Field of Classification Search ................ 257/295, 257/421; 365/158
See application file for complete search history.

(56) References Cited

U.S. PATENT DOCUMENTS

| 6,532,164 | B2 * | 3/2003 | Redon et al. ................ 365/97 |
| 6,815,083 | B2 * | 11/2004 | Nemoto et al. ........... 428/828.1 |
| 6,838,740 | B2 * | 1/2005 | Huai et al. .................. 257/421 |
| 6,888,742 | B1 * | 5/2005 | Nguyen et al. ............. 365/158 |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

Daughton, et al., Patent Publication US2003/0007398 dated Jan. 9, 2003 Figures 3, 4, 5A: Paragraphs 60,61,67,68.

* cited by examiner

*Primary Examiner*—David Nelms
*Assistant Examiner*—Dao H. Nguyen
(74) *Attorney, Agent, or Firm*—Sawyer Law Group LLP

(57) ABSTRACT

A method and system for providing a magnetic element that can be used in a magnetic memory is disclosed. The magnetic element includes pinned, nonmagnetic spacer, and free layers. The spacer layer resides between the pinned and free layers. The free layer can be switched using spin transfer when a write current is passed through the magnetic element. The magnetic element may also include a barrier layer, a second pinned layer. Alternatively, second pinned and second spacer layers and a second free layer magnetostatically coupled to the free layer are included. At least one free layer has a high perpendicular anisotropy. The high perpendicular anisotropy has a perpendicular anisotropy energy that is at least twenty and less than one hundred percent of the out-of-plane demagnetization energy.

33 Claims, 12 Drawing Sheets

SPIN TRANSFER MAGNETIC ELEMENT WITH FREE LAYERS HAVING HIGH PERPENDICULAR ANISOTROPY AND IN-PLANE EQUILIBRIUM MAGNETIZATION

FIELD OF THE INVENTION

The present invention relates to magnetic memory systems, and more particularly to a method and system for providing a magnetic element that employs a spin transfer effect in switching, and that can be switched using a lower switching current density.

BACKGROUND OF THE INVENTION

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional conductive spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional spacer layer 16 is nonmagnetic. The AFM layer 12 is used to fix, or pin, the magnetization of the pinned layer 14 in a particular direction. The magnetization of the free layer 18 is free to rotate, typically in response to an external magnetic field. Also depicted are top contact 20 and bottom contact 22 that can be used to drive current through the conventional magnetic element 10. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high. To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B).

In addition, films having a perpendicular anisotropy have been used in conventional MRAM to obtain certain desired properties. For example, GdFe and GdCoFe having perpendicular anisotropy have been used in magnetic elements, as disclosed by Naoki Nishimura, et al. in "Magnetic tunnel junction device with perpendicular magnetization films for high-density magnetic random access memory", Journal of Applied Physics, Volume 91, Number 8, pp. 5246–5249, 15 Apr. 2002. However, the structures disclosed by Nishimura's were designed for standard field-based-writing MRAM devices. Thus, the magnetization of such conventional free layers is switched by applying an external magnetic field to the magnetic element. In addition, in contrast to the magnetic elements 10/10', the magnetic elements disclosed by Nishimura have their equilibrium magnetizations oriented perpendicular to the film plane. Thus, the magnetization of the free layer would be in the z-direction as depicted in FIGS. 1A and 1B in such conventional magnetic elements.

In order to overcome certain issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions as a mechanism for switching the conventional magnetic elements 10 and 10', one of ordinary skill in the art will readily recognize that a high current density is typically required to induce switching for the conventional magnetic elements 10 and 10'. In particular, the switching current density is on the order of a few $10^7$ A/cm$^2$ or greater. Thus, a high write current is used to obtain the high switching current density. The high operating current leads to design problems for high density MRAM, such as heating, high power consumption, large transistor size, as well as other issues. Moreover, if a spin valve such as the conventional element 10 is used, the output signal is small. In the conventional magnetic element 10, both the total resistance and the change in resistance in SV-based spin transfer elements are small typically less than two Ohms and five percent, respectively.

One proposed method of increasing the output signal is to use a spin tunneling junction, such as the conventional magnetic element 10', for the spin transfer device. The conventional magnetic element 10' can exhibit large resistance and large signal. For example resistances in excess of one thousand Ohms and a greater than forty percent percentage change in resistance, respectively. However, one of ordinary skill in the art will readily recognize that the use of the conventional magnetic element 10' requires a small operating current to keep the conventional magnetic element 10' from deteriorating or breaking down.

Accordingly, what is needed is a system and method for providing a magnetic memory element having elements that can be switched using spin transfer at a lower current density and that consume less power. The present invention addresses such a need.

SUMMARY OF THE INVENTION

The present invention provides a method and system for providing a magnetic element that can be used in a magnetic memory. The magnetic element comprises at least pinned, nonmagnetic spacer, and free layers. The spacer layer resides between the pinned and free layers. The magnetic element is configured to allow the free layer to be switched using spin transfer when a write current is passed through the magnetic element. In some aspects, the magnetic element further comprises a barrier layer, a second pinned layer. In other aspects, the magnetic element further comprises a second spacer layer, a second pinned layer and a second free layer magnetostatically coupled to the first free layer. In such aspects, the second spacer layer is between the second pinned and second free layers and a separation layer is preferably provided between the first and second free layers to ensure they are magnetostatically coupled. The free layer(s) have a high perpendicular anisotropy. For one or more of the free layers, the perpendicular anisotropy has a high perpendicular anisotropy energy that is at least twenty percent and less than one hundred percent of the out-of-plane demagnetization energy.

According to the system and method disclosed herein, the present invention provides a magnetic element that can be switched due to spin transfer using a lower current density and the attendant advantages of a lower switching current density.

DETAILED DESCRIPTION OF THE INVENTION

Figure 1A:
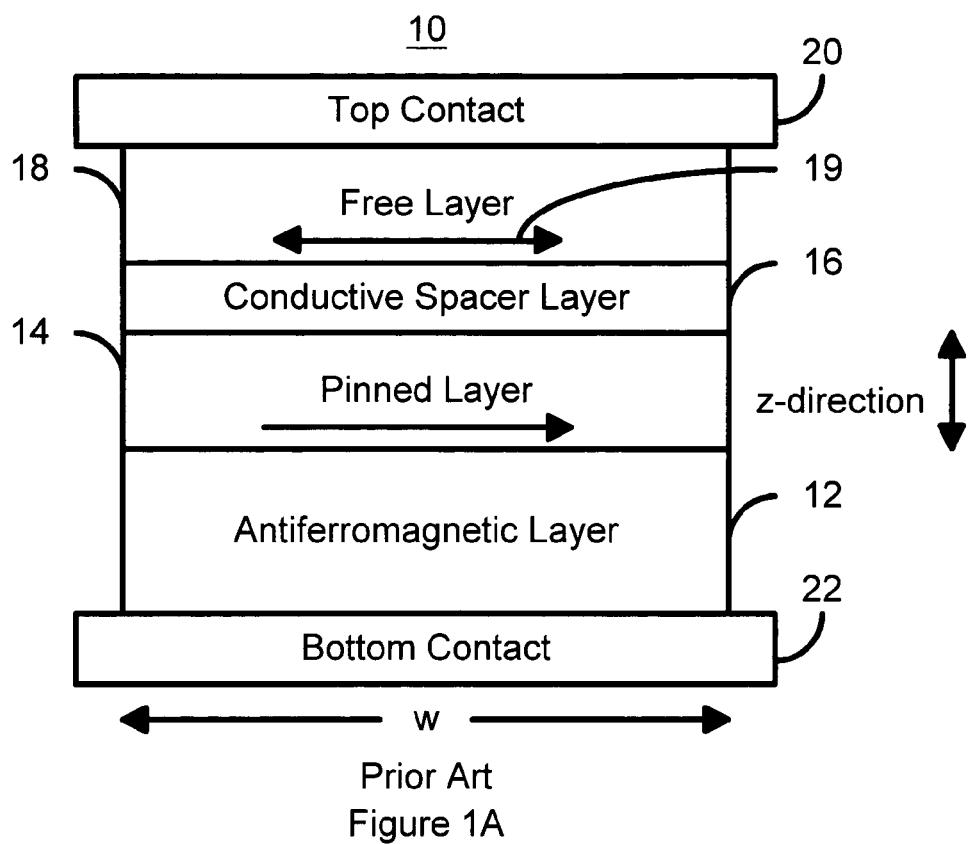
FIG. 1A is a diagram of a conventional magnetic element, a spin valve.
Figure 1B:
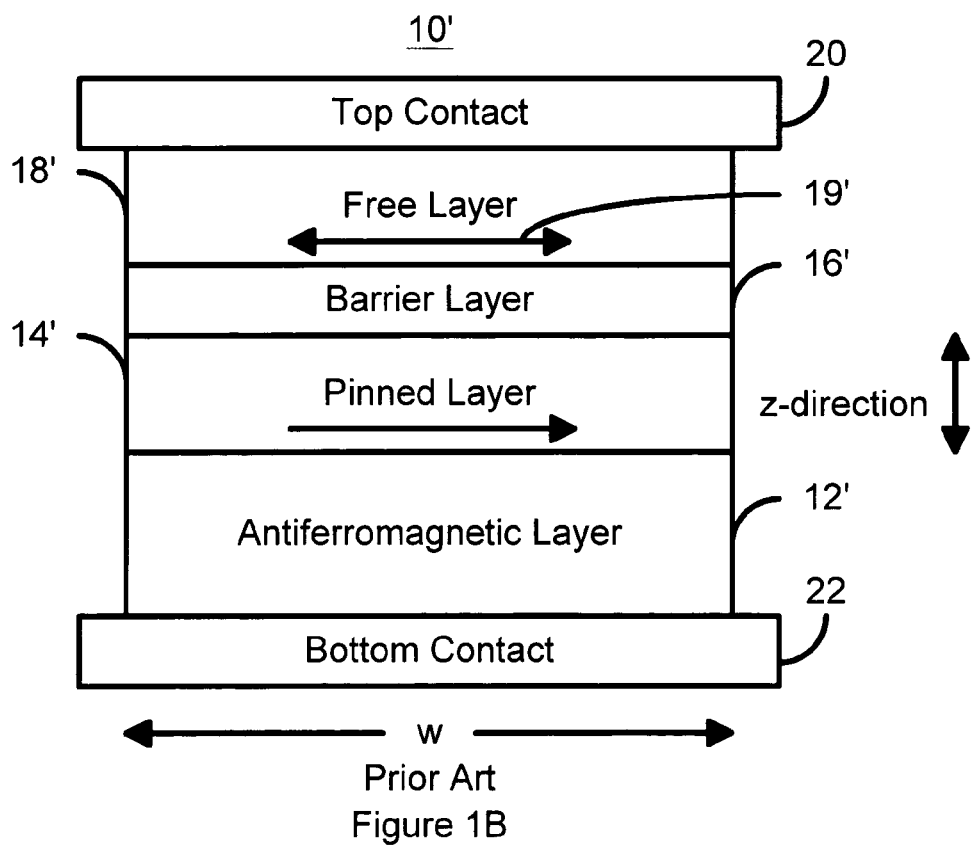
FIG. 1B is a diagram of another conventional magnetic element, a spin tunneling junction.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic element that can be used in a magnetic memory. The magnetic element comprises at least pinned, nonmagnetic spacer, and free layers. The spacer layer resides between the pinned and free layers. The magnetic element is configured to allow the free layer to be switched using spin transfer when a write current is passed through the magnetic element. In some aspects, the magnetic element further comprises a barrier layer, a second pinned layer. In other aspects, the magnetic element further comprises a second spacer layer, a second pinned layer and a second free layer magnetostatically coupled to the first free layer. In such an aspect, the second spacer layer is between the second pinned and second free layers and a separation layer is preferably provided between the first and second free layers to ensure they are magnetostatically coupled. In one aspect, one or more of the free layers has a perpendicular anisotropy. The perpendicular anisotropy has a perpendicular anisotropy energy at least twenty percent and, in general, less than one hundred percent of the out-of-plane demagnetization energy.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. For example, although the method and system are described in the context of simple free layers, nothing prevents the present invention from being used with synthetic free layers. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines. The present invention is also described in the context of a particular mechanism, a high anisotropy, for providing a lower switching current density. However, one of ordinary skill in the art will readily recognize that the method and system described herein can be combined with other mechanisms for reducing the switching current density, such as a low saturation magnetization free layer.

Figure 2A:
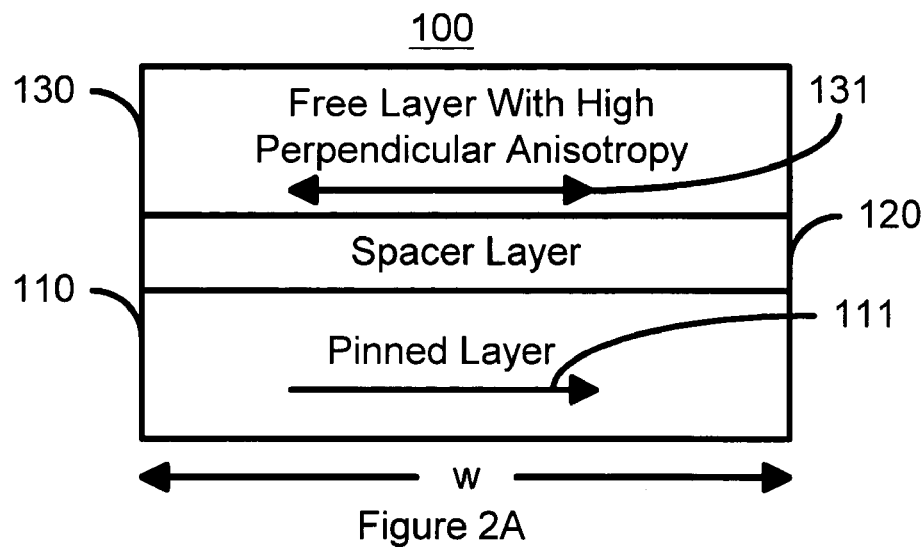
FIG. 2A depicts a first embodiment of a portion of a magnetic element in accordance with the present invention having a reduced write current density for spin transfer switching.

To more particularly illustrate the method and system in accordance with the present invention, refer now to FIG. 2A, depicting a first embodiment of a portion of a magnetic element 100 in accordance with the present invention having a reduced write current density for spin transfer. The magnetic element 100 is preferably used in a magnetic memory, such as a MRAM. Thus, the magnetic element 100 may be used in a memory cell including an isolation transistor (not shown), as well as other configurations of magnetic memories. Moreover, the magnetic element 100 preferably utilizes two terminals (not shown) near the top and bottom of the magnetic element. However, nothing prevents the use of another number of terminals, for example a third terminal near the center of the magnetic element. The magnetic element 100 includes a pinned layer 110, a spacer layer 120, and a free layer 130. As described below, the free layer 130 is configured to have a high perpendicular anisotropy. The magnetic element 100 generally also includes an AFM layer (not shown) used to pin the magnetization 111 of the pinned layer 110, as well as seed layers (not shown) and capping layers (not shown). Furthermore, the magnetic element 100 is configured such that the free layer 130 can be written using spin transfer. In a preferred embodiment, the lateral dimensions, such as the width w, of the free layer 130 are thus small and preferably less than two hundred nanometers. In addition, some difference is preferably provided between the lateral dimensions to ensure that the free layer 130 has a particular easy axis in the plane of the free layer 130.

The pinned layer 110 is ferromagnetic. In one embodiment the pinned layer 110 is synthetic. In such an embodiment, the pinned layer 110 includes ferromagnetic layers separated by nonmagnetic layers and is configured such that the ferromagnetic layers are aligned antiparallel. The pinned layer 110 may be configured to increase the spin dependence of the bulk resistivity of the magnetic element 100. For example, the pinned layer 110, or its ferromagnetic layers, may be a multilayer made up of repeated bilayers (not explicitly shown in FIG. 2A). In one such embodiment, the pinned layer 110 could be a multilayer of (Fe$_x$Co$_{1-x}$/Cu)n, where n is the number of times the Fe$_x$Co$_{1-x}$/Cu bilayer is repeated. In such embodiment, n is greater than one and the Cu layer of the bilayer is preferably one through eight Angstroms thick. The spacer layer 120 is nonmagnetic. In one embodiment, the spacer layer 120 may be conductive, for example including Cu. In another embodiment, the spacer layer 120 is a barrier layer including an insulator such as alumina. In such an embodiment, the barrier layer 120 is less than two nanometers thick such that charge carriers can tunnel between the free layer 130 and the pinned layer 110.

Figure 2B:
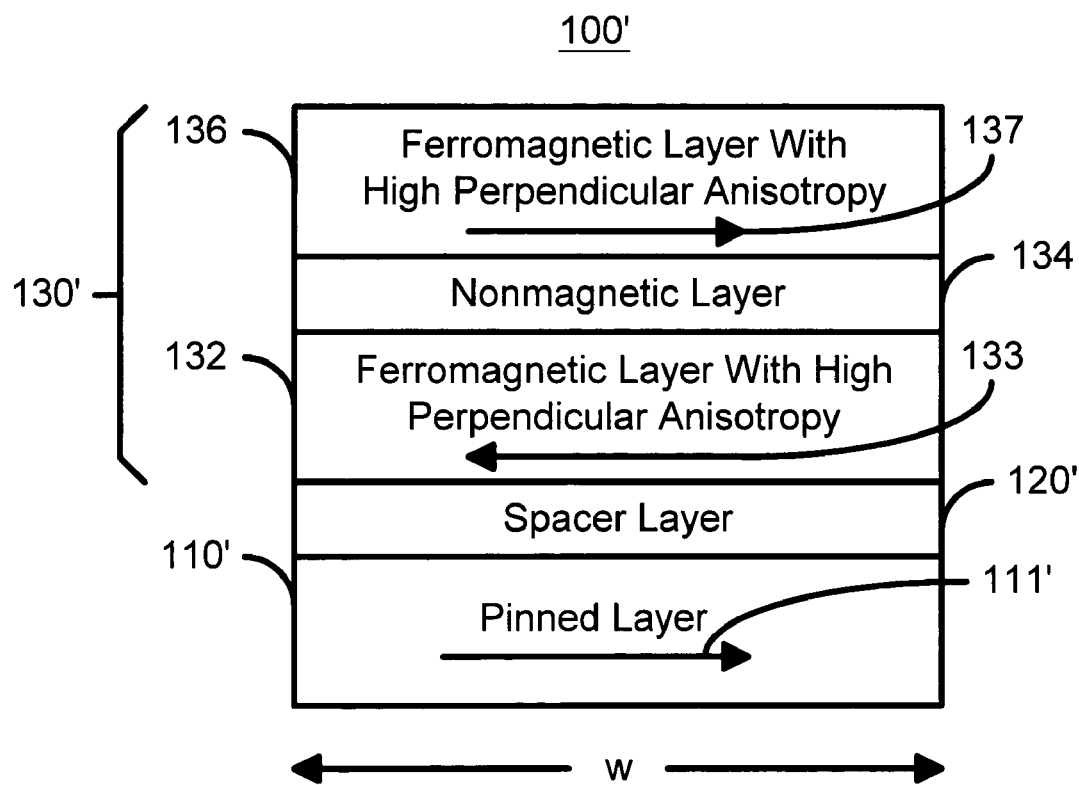
FIG. 2B depicts another version of the first embodiment of a portion of a magnetic element in accordance with the present invention having a reduced write current density for spin transfer switching.

The free layer 130 is ferromagnetic and is configured to have a high perpendicular anisotropy. As used herein, a high perpendicular anisotropy occurs for the simple free layer 130 when the perpendicular anisotropy of the free layer 130 has a corresponding perpendicular anisotropy energy that is at least twenty percent and less than one hundred percent of the demagnetization energy. FIG. 2B depicts a magnetic element 100' that is analogous to the magnetic element 100. Thus, analogous components are labeled similarly. The magnetic element 100', therefore, includes a free layer 130' that can be written using spin transfer and that has a high perpendicular anisotropy. However, the free layer 130' is synthetic, including two ferromagnetic layers 132 and 136 separated by a nonmagnetic layer 134 that is preferably Ru. The nonmagnetic layer 134 is configured so that the magnetizations 133 and 137 of the free layer 130' are aligned antiparallel. The free layer 130' has a high perpendicular anisotropy because the ferromagnetic layers 132 and 136 have a high perpendicular anisotropy. Thus, the perpendicular anisotropy of the ferromagnetic layers 132 and 136 corresponds to a perpendicular anisotropy energy that is at least twenty percent and less than one hundred percent of the demagnetization energy of the ferromagnetic layers 132 and 136, respectively. Referring to FIGS. 2A and 2B, the high perpendicular anisotropy is defined to have a perpendicular anisotropy energy that is at least twenty percent but less than one hundred percent of the demagnetization energy. Consequently, although the perpendicular anisotropy is substantial, the equilibrium magnetization of the free layer 130 or the constituent ferromagnetic layers 132 and 136 lie in plane (no components up or down in FIGS. 2A and 2B). For clarity, the discussion below primarily refers to the free layer 130. However, the principles discussed also apply to the free layer 130', including ferromagnetic layers 132 and 136, and the magnetic element 100'.

A high perpendicular anisotropy occurs when the perpendicular anisotropy energy of the free layer 130 is greater than twenty percent but less than one hundred percent of the out-of-plane demagnetization energy of the free layer 130. As a result, the magnetization 131 of the free layer 130 lies in plane at equilibrium (in the absence of a write current or a sufficient external magnetic field). The high perpendicular anisotropy is preferably provided using materials having a high perpendicular crystalline anisotropy and/or by stressing the layer in some manner. The high perpendicular anisotropy should reduce the critical switching current density, $J_c$, required to switch the magnetization of the free layer 130 due to spin transfer.

The ability of the high perpendicular anisotropy free layer to reduce the switching current density can be understood using the prevalent spin transfer spin-torque model described in J. C. Slonczewski, "Current-driven Excitation of Magnetic Multilayers," *Journal of Magnetism and Magnetic Materials*, vol. 159, p. L1–L5 (1996). According to Slonczewski's model, the switching current density Jc for the free layer of a spin transfer stack is proportional to:

$$\alpha t M_s [H_{eff} - 2\pi M_s]/g(\theta)$$

where:
α=the phenomenological Gilbert damping constant;
t=the thickness of the free layer;
$M_s$=saturation magnetization of the free layer;
$H_{eff}$=effective field for the free layer;
g(θ) reflects the spin-transfer efficiency The effective field, $H_{eff}$, includes the external magnetic field, shape anisotropy fields, in-plane and out-of-plane (i.e. perpendicular) anisotropies, and dipolar and exchange fields. The perpendicular anisotropy typically arises from crystalline anisotropy. The term g(θ) depends on the relative angular orientations of the magnetizations of the pinned layer 110 and the free layer 130.

The ability of a high perpendicular anisotropy to reduce the switching current density can be explained as follows. For the majority of magnetic materials, the out-of-plane demagnetization term $2\pi M_s$ is much greater than $H_{eff}$. For instance, for a thin film ellipse of Co with the majority axis of 200 nm, minority axis of 100 nm, and thickness of 20 Å, the term $2\pi M_s$ is approximately 8 kOe, which is much larger than $H_{eff}$ that is less than a few hundred Oe. A high perpendicular anisotropy, generally a crystalline anisotropy, can be introduced into the free layer 130 to offset most, but not all, of the out-of-plane demagnetization. Thus, as defined above, the high perpendicular anisotropy has a perpendicular anisotropy energy that is less than one hundred percent of the demagnetization energy. The high perpendicular anisotropy has a perpendicular anisotropy energy that is preferably between twenty and ninety five percent (and in a preferred embodiment, is ninety percent) of the demagnetization energy. Because the out-of-plane demagnetization energy would then be still larger than the perpendicular anisotropy energy, the equilibrium magnetization 131 of the free layer 130 should remain in-plane. However, because the perpendicular anisotropy has been greatly increased, the difference between the effective field $H_{eff}$ (which includes the perpendicular anisotropy), and the demagnetization term $2\pi M_s$, is decreased. Thus, the equilibrium magnetic moment of the free layer 130 remains in plane, but can be switched using a lower switching current density. In short, to reduce the switching current density for a spin transfer induced switching of the magnetization 131 of the free layer 130, a high perpendicular anisotropy should be provided for the free layer 130.

The high perpendicular anisotropy for the free layer 130 can be provided in a number of ways. In order to provide a high perpendicular anisotropy, materials used in the free layer 130, or the constituent ferromagnetic layers 132 and 136, could include materials having a high perpendicular anisotropy due to their crystal structure. In one embodiment, the free layer 130 or the ferromagnetic layers 132 and 134 include Co and CoFe; or Co and CoFe alloyed with Cr, Pt, and/or Pd where the compositions of Cr, Pt, and Pd are chosen to give high perpendicular anisotropy, as defined above. In a preferred embodiment, the compositions of Cr, Pt, and/or Pd in Co and CoFe are adjusted to satisfy the condition that the perpendicular anisotropy energy is between twenty and ninety five percent, and preferably ninety percent, of the out-of-plane demagnetization energy.

In an alternative embodiment, the free layer 130 or the ferromagnetic layers 132 and 134 can include multilayers [Co/Pd]n/Co, [Co/Pt]n/Co, [CoFe/Pd]n/CoFe, [CoFe/Pt]n/

CoFe, [CoCr/Pd]n/CoCr, or [CoCr/Pt]n/CoCr where n is between 1 and 10, Co 3 A to 20 A, CoFe 3 A to 20 A, CoCr 3 A to 20 A, Pd 10A to 100A, Pt 10A to 100A. The exact thicknesses of Co, CoFe, CoCr, Pd, and Pt are chosen so that the perpendicular anisotropy energy is between twenty and ninety five percent of the out-of-plane demagnetization energy of the multilayers. The perpendicular anisotropy in these multilayers is attributed to surface anisotropy at the ferromagnetic/Pd or Pt interfaces and to the strain in thin Co layers.

Figure 3A:
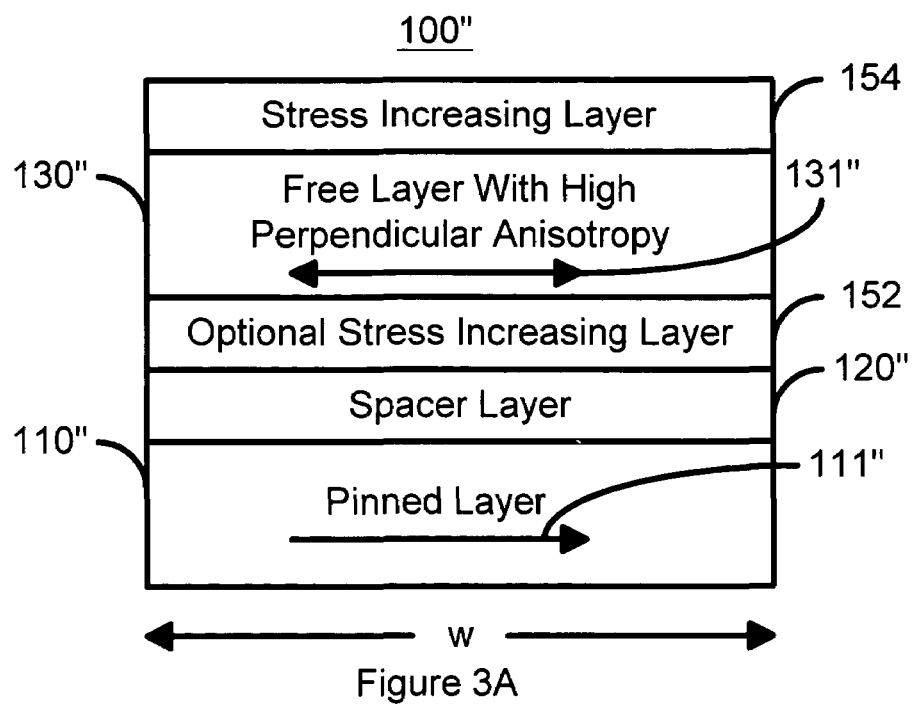
FIG. 3A depicts a second version of the first embodiment of a portion of a magnetic element in accordance with the present invention having a reduced write current density for spin transfer switching due to at least a high perpendicular anisotropy.

FIG. 3A depicts another version 100" of the first embodiment of a portion of a magnetic element in accordance with the present invention having a reduced write current density for spin transfer switching. The magnetic element 100" is analogous to the magnetic element 100. Thus, analogous components are labeled similarly. Therefore, the magnetic element includes a free layer 130" that has a high perpendicular anisotropy and which is written using spin transfer. Moreover, the magnetic element 100" preferably utilizes two terminals (not shown) near the top and bottom of the magnetic element. However, nothing prevents the use of another number of terminals, for example a third terminal near the center of the magnetic element. In a preferred embodiment, the free layer 130" includes Co, CoCr, CoPt, CoCrPt, CoFe, CoFeCr, CoFePt, CoFeCrPt, or their multilayer combinations, which have an intrinsic high perpendicular anisotropy. The magnetic element 100" also includes optional stress increasing layers 152 and 154. One or both of the stress increasing layers 152 and 154 may be used. The layer 154 is used to alter the stress and the surface anisotropy of the free layer 130", leading to further enhancement of the total perpendicular anisotropy. The stress increasing layer 152 is a seed layer that also enhances the total perpendicular anisotropy of the free layer 130". The stress increasing layer 152 may act as part of the spacer layer 120" when the spacer layer 120" is conductive. However, if the spacer layer 120" is an insulating barrier layer, the inclusion of the stress increasing layer 152 can cause a significant degradation in signal. In such an embodiment, the stress increasing layer 152 is, therefore, undesirable. The stress increasing layers 152 and 154 may include a few Angstroms of materials such as Pt, Pd, Cr, Ta, Au, and Cu that further promote perpendicular anisotropy in the free layer 130". However, note that the use of Pt and Pd either within the free layer 130" or adjacent layers 152 and 154 could increase the phenomenological Gilbert damping constant, $\alpha$. An increase in $\alpha$ could negate some or all of the switching current density reduction brought about by high perpendicular anisotropy in the free layer 130". In addition, the perpendicular anisotropy of the materials above, such as Co, CoCr, CoPt, CoCrPt, CoFe, CoFeCr, CoFePt, and CoFeCrPt, can be further increased by intrinsic stress in the film itself. This intrinsic stress may be induced during the film deposition and/or by surrounding the spin transfer stack (containing the free layer 130") with an insulator (dielectric) of high compressive stress.

Figure 3B:
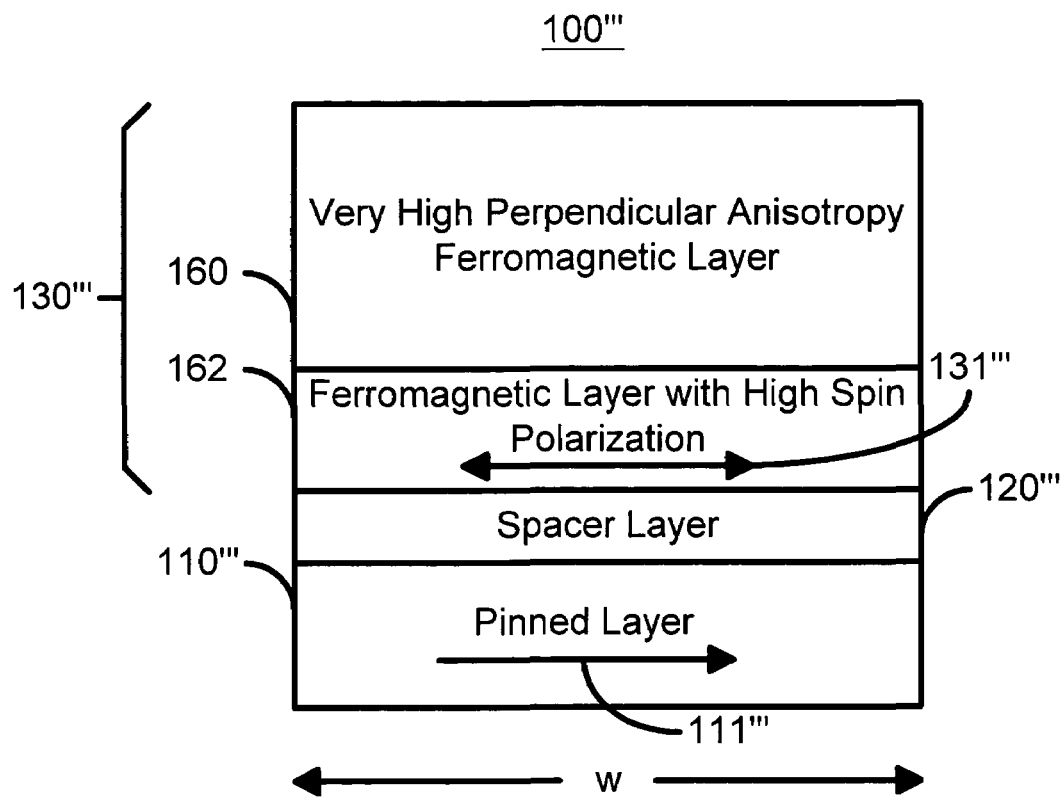
FIG. 3B depicts a third version of the first embodiment of a portion of a magnetic element in accordance with the present invention having a reduced write current density for spin transfer switching due to at least a high perpendicular anisotropy.

FIG. 3B depicts another version 100''' of the first embodiment of a portion of a magnetic element in accordance with the present invention having a reduced write current density for spin transfer. The magnetic element 100''' is analogous to the magnetic element 100. Therefore, the magnetic element 100''' includes a free layer 130''' that has a high perpendicular anisotropy, an optional low saturation magnetization, and which is written using spin transfer. Moreover, the magnetic element 100''' preferably utilizes two terminals (not shown) near the top and bottom of the magnetic element. However, nothing prevents the use of another number of terminals, for example a third terminal near the center of the magnetic element.

The free layer 130''' has a high perpendicular anisotropy, as defined above. The free layer 130''' also includes a very high perpendicular anisotropy ferromagnetic layer 160 and a ferromagnetic layer 162. In a preferred embodiment, the high perpendicular anisotropy of the free layer 130''' is provided at least in part due to the very high perpendicular anisotropy ferromagnetic layer 160. The very high perpendicular anisotropy ferromagnetic layer 160 has a very high perpendicular anisotropy. As used herein, a very high perpendicular anisotropy has a perpendicular anisotropy energy that exceeds the out-of-plane demagnetization energy. As a result, a film having a very high perpendicular anisotropy, when standing alone, would have its equilibrium magnetization perpendicular to the plane. The very high perpendicular anisotropy ferromagnetic layer 160 is preferably a rare earth-transition metal alloy, such as GdFe and GdCoFe, where the rare earth may be in the range of five to sixty atomic percent. Such rare earth-transition metal alloys have relatively low damping constants and high or very high perpendicular anisotropy. The very high perpendicular anisotropy ferromagnetic layer 160 preferably has a perpendicular anisotropy energy larger than its own out-of-plane demagnetization energy. The ferromagnetic layer 162 has a high spin polarization. Thus, the ferromagnetic layer 162 preferably includes one or more high spin-polarization materials such as Co, Fe, or CoFe. The ferromagnetic layer 162 has a perpendicular anisotropy energy that is smaller than its out-of-plane demagnetization energy. The very high perpendicular anisotropy ferromagnetic layer 160 and the ferromagnetic layer 162 are exchange-coupled.

The exchange-coupled combination of the very high perpendicular anisotropy sublayer 160 and the high spin polarization ferromagnetic layer provide a total high perpendicular anisotropy for the free layer 130'''. At larger thickness of the very high perpendicular anisotropy ferromagnetic layer 160, the total perpendicular anisotropy energy of the combination of the very high perpendicular anisotropy ferromagnetic layer 160 and the ferromagnetic layer 162 exceeds the total out-of-plane demagnetization energy for the very high perpendicular anisotropy ferromagnetic layer 160 and the ferromagnetic layer 162. In such a case, the magnetizations of both the very high perpendicular anisotropy ferromagnetic layer 160, the ferromagnetic layer 162 and thus the free layer 130''' would be oriented perpendicular to the film plane. If the thickness of the very high perpendicular anisotropy ferromagnetic layer 160 is reduced, however, the total perpendicular anisotropy energy of the very high perpendicular anisotropy ferromagnetic layer 160 and the ferromagnetic layer 162 is reduced faster than the total out-of-plane demagnetization energy of the very high perpendicular anisotropy ferromagnetic layer 160 and the ferromagnetic layer 162. Stated differently, the total perpendicular anisotropy energy of the free layer 130''' is reduced more rapidly than the total out-of-plane demagnetization energy of the free layer 130'''. Alternatively, if the thickness of the high spin-polarization ferromagnetic 162 is increased, the total perpendicular anisotropy energy of the very high perpendicular anisotropy ferromagnetic layer 160 and the ferromagnetic layer 162 is increased more slowly than the total out-of-plane demagnetization energy of the very high perpendicular anisotropy ferromagnetic layer 160 and the ferromagnetic layer 162. Stated differently, the total perpendicular anisotropy energy of the free layer 130''' is increased more slowly than the out-of-plane demagnetization energy of the free layer 130'''. When the total perpendicular anisotropy energy becomes less than the total out-of-plane demagnetization energy, the equilibrium magnetizations of the very high perpendicular anisotropy ferromagnetic layer 160 and the ferromagnetic layer 162 rotate into the film plane. Stated differently, the perpendicular anisotropy energy of the free layer 130''' is less than the out-of-plane demagnetization energy of the free layer 130''' and the magnetization of the free layer 130''' is in plane even though the free layer 130''' has a high perpendicular anisotropy. Thus, to decrease the spin-transfer switching current, the thicknesses of the very high perpendicular anisotropy ferromagnetic layer 160 and the ferromagnetic layer 162 are tailored such that the total perpendicular crystalline anisotropy is high. Stated differently, the perpendicular anisotropy of the combination of the layers 160 and 162 has a perpendicular anisotropy energy that is at least twenty and less than one hundred percent of the demagnetization energy. In a preferred embodiment, this anisotropy energy is ninety percent of the total out-of-plane demagnetization energy. For example, in one embodiment, the magnetic element 100''' could be a top MTJ, having the free layer 130''' at the bottom closest to the substrate, the spacer or barrier layer 120''' and a pinned layer 110''' at the top. Such a magnetic element would include: very high perpendicular anisotropy ferromagnetic layer 160/ferromagnetic layer 162/spacer (barrier) layer 120'''/pinned layer 110'''/pinning or AFM layer (not shown). Thus, an example of the magnetic element 100''' is given by: AlCu[250 A]/GdFeCo[t]/CoFe[10 A]/Al2O3[8 A]/CoFe[30 A]/PtMn[150 A], where the thickness, t, of GdFeCo is preferably adjusted between ten and four hundred Angstroms so that the that the total perpendicular crystalline anisotropy energy is between at least twenty and less than one hundred percent, preferably ninety percent, of the total out-of-plane demagnetization energy. Thus, the equilibrium magnetic moment of the free layer 130''' should remain in-plane.

In an alternative embodiment, the very high perpendicular anisotropy ferromagnetic layer 160 can include multilayers [Co/Pd]n/Co, [Co/Pt]n/Co, [CoFe/Pd]n/CoFe, [CoFe/Pt]n/CoFe, [CoCr/Pd]n/CoCr, or [CoCr/Pt]n/CoCr where n is between 1 and 10, Co 3 A to 20A, CoFe 3A to 20A, CoCr 3A to 20A, Pd 10A to 100A, Pt 10 A to 100 A. The repeat number n and the exact thicknesses of Co, CoFe, CoCr, Pd, and Pt are chosen so that the total perpendicular anisotropy energy is between twenty and ninety five percent of the total out-of-plane demagnetization energy of the free layer 130'''.

Thus, the magnetic elements 100, 100', 100'', and 100''' utilize free layers having a high perpendicular anisotropy. Consequently, the magnetic elements 100, 100', 100'', and 100''' can be written using spin transfer at a lower switching current density. Furthermore, aspects of the magnetic elements 100, 100', 100'', and 100''' can be combined to further raise the perpendicular anisotropy. Thus, a further reduction in current or another improvement in the properties of the magnetic elements 100, 100', 100'', and/or 100''' can be achieved.

Figure 4:
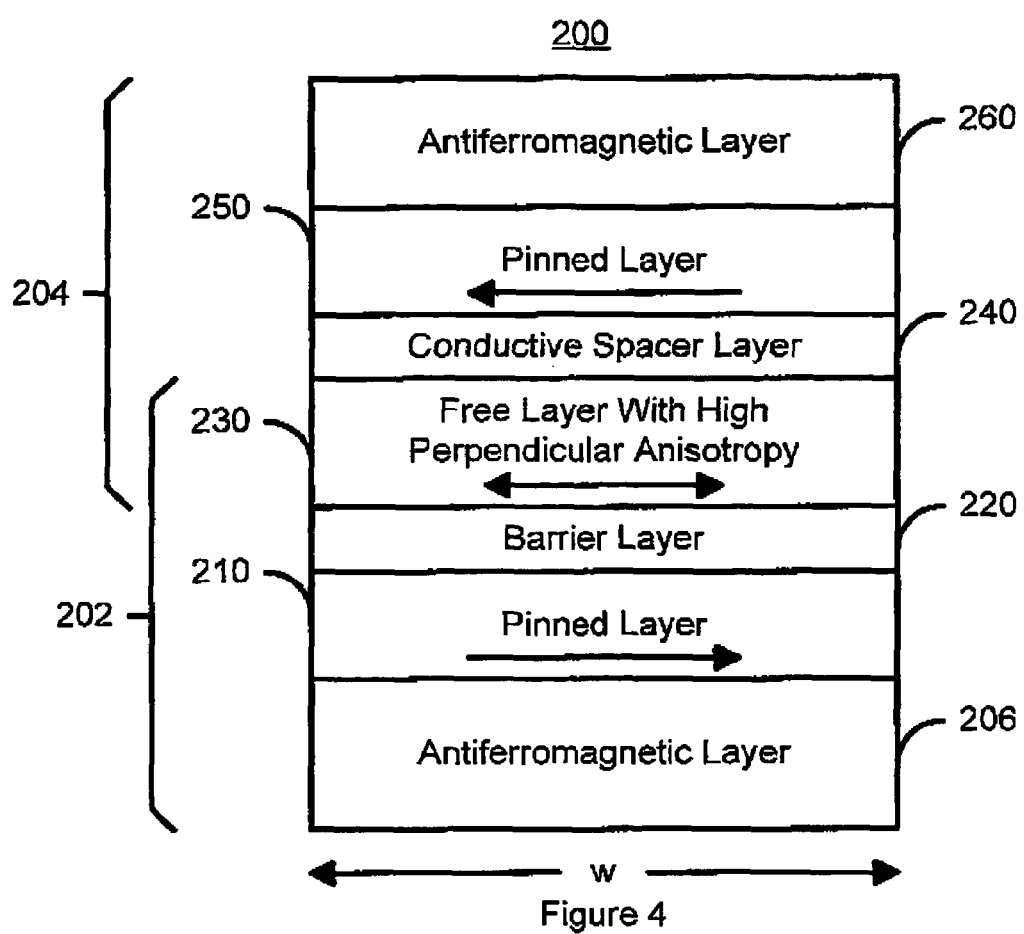
FIG. 4 depicts a second embodiment of a magnetic element in accordance with the present invention having a reduced write current density for spin transfer switching.

FIG. 4 depicts a second embodiment of a magnetic element 200 in accordance with the present invention having a reduced write current density for spin transfer. The magnetic element 200 includes a spin valve portion 204 and a spin tunneling junction portion 202 that share a free layer 230. The spin valve portion 204 includes a pinning layer 260 that is preferably an antiferromagnetic (AFM) layer 260, pinned layer 250, conductive spacer layer 240 such as Cu, and a free layer 230. In an alternate embodiment, the conductive spacer layer 240 could be replaced by a barrier layer. The spin tunneling junction portion 202 includes a pinning layer 206 that is preferably an antiferromagnetic (AFM) layer 206, pinned layer 210, barrier layer 220 that is an insulator configured to allow electrons to tunnel through it, and the free layer 230. Referring to FIGS. 2A and 4, the layers 250, 240, and 230 are analogous to the layers 110, 120, and 130 in the magnetic element 100 when the spacer layer 120 is conducting. Similarly, the layers 210, 220, and 230 are analogous to the layers 110, 120, and 130, respectively, when the spacer layer 120 is an insulating barrier layer. The pinned layers 210 and 250 thus preferably correspond to the pinned layers 110 and can be configured using analogous materials, layers, and/or process. For example, the pinned layer 210 and/or the pinned layer 250 may include multilayer (Fe$_x$Co$_{1-x}$/Cu)n, where the n is the number of repeats that is greater than one. In addition, the Fe atomic percent, x, is preferably approximately 0.5 and the Cu layers are preferably one through eight Angstroms thick. The free layer 230 is configured to be written using spin transfer and has a high perpendicular anisotropy. Moreover, the magnetic element 200 preferably utilizes two terminals (not shown) near the top and bottom of the magnetic element. However, nothing prevents the use of another number of terminals, for example a third terminal near the center of the magnetic element 200. The magnetic element 200 also includes pinning layers 206 and 260 that are preferably AFM layers used in pinning the magnetizations of the pinned layers 210 and 250, respectively.

The free layer 230 is preferably configured in a manner analogous to the free layers 130, 130', 130'', and/or 130'''. Thus, analogous materials and principles to those discussed above may be used to achieve the high perpendicular anisotropy of the free layer 230. Materials having a high crystalline perpendicular anisotropy and/or other conditions such as stress could be used to achieve the high perpendicular anisotropy for the free layer 230. In addition, as discussed above with respect to the free layer 130', the free layer 230 can be synthetic. Consequently, the magnetic element 200 can be written using spin transfer at a lower switching current density. Stated differently, the magnetic element 200 can share the benefits of the magnetic elements 100, 100', 100'', 100''', and/or their combinations. Furthermore, when the pinned layers 210 and 250 are aligned antiparallel, both the spin valve portion 204 and the spin tunneling junction portion 202 can contribute to writing the free layer 230. Because of the use of the barrier layer 220, the magnetic element 200 has higher resistance and magnetoresistance. Consequently, a higher signal may be obtained during reading.

Figure 5A:
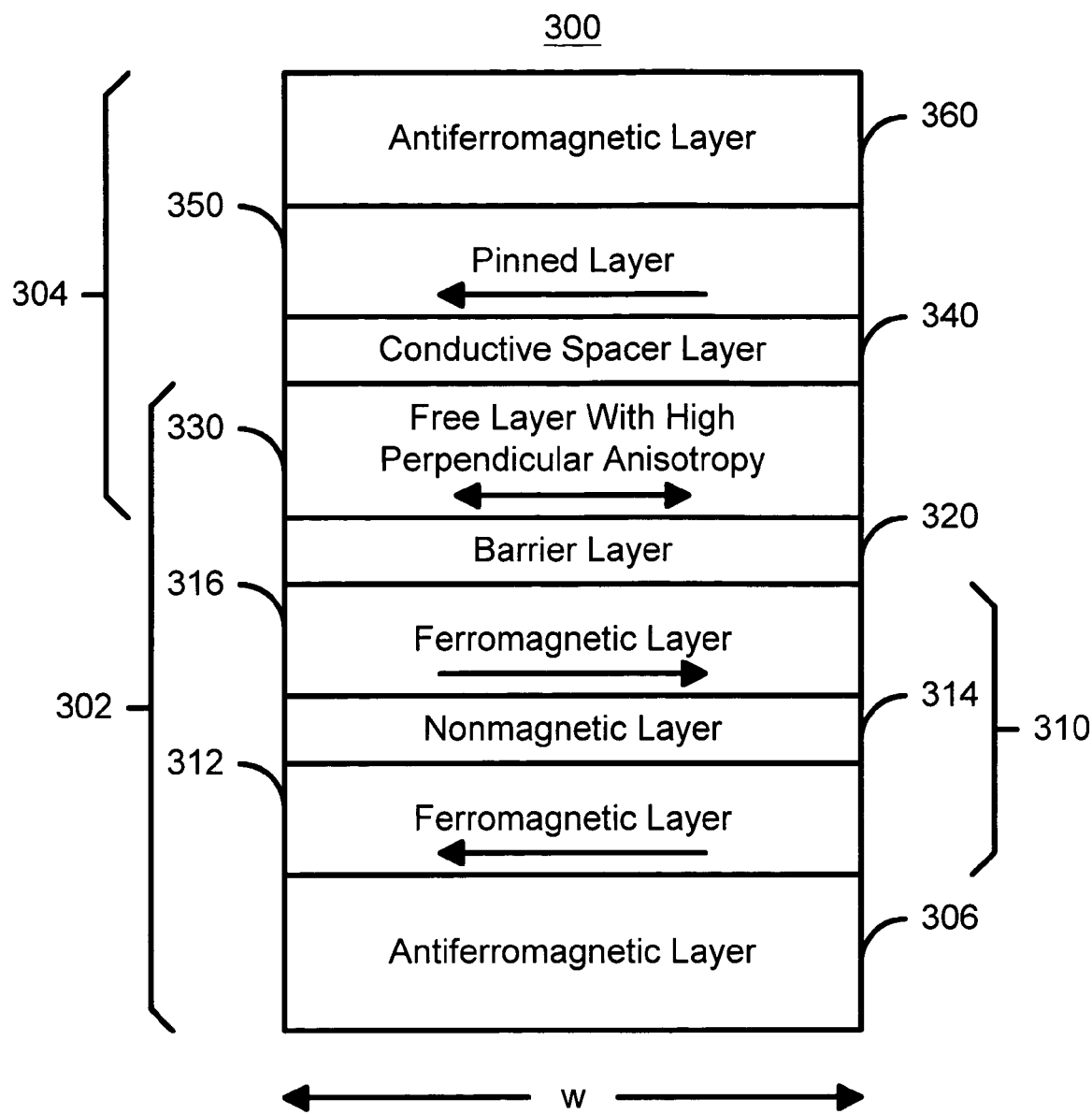
FIG. 5A is a preferred version of the second embodiment of a magnetic element in accordance with the present invention having a reduced write current density for spin transfer switching.

FIG. 5A is a preferred version of the second embodiment of a magnetic element 300 in accordance with the present invention having a reduced write current density for spin transfer. The magnetic element 300 is analogous to the magnetic element 200 depicted in FIG. 4. Thus, analogous components are labeled similarly. Therefore, the magnetic element includes a free layer 330, which corresponds to the free layer 230, that has a high perpendicular anisotropy is written using spin transfer. Moreover, the magnetic element 300 preferably utilizes two terminals (not shown) near the top and bottom of the magnetic element. However, nothing prevents the use of another number of terminals, for example a third terminal near the center of the magnetic element.

The free layer 330 is preferably configured in a manner analogous to the free layers 130, 130', 130'', 130''', and/or the free layer 230. Thus, analogous materials and principles to those discussed above may be used to achieve the high perpendicular anisotropy of the free layer 330. For example, materials having a high crystalline perpendicular anisotropy and/or other conditions such as stress could be used to achieve the high perpendicular anisotropy for the free layer 330. Thus, the materials discussed above with respect to the free layers 130, 130', 130", and 130'" are preferred. In addition, as discussed above with respect to the free layer 130', the free layer 330 can be synthetic. Because of the high perpendicular anisotropy, the magnetic element 300 can be written using spin transfer at a lower switching current density. Stated differently, the magnetic element 300 can share the benefits of the magnetic elements 100, 100', 100", 100'" and/or their combinations. Because of the use of the barrier layer 320, the magnetic element 300 has higher resistance and magnetoresistance. Consequently, a higher signal may be obtained during reading. In an alternate embodiment, the barrier layer 320 may be replaced by a conducting layer. However, in such an embodiment, the read signal is decreased for a given read current.

In the magnetic element 300, the pinned layer 310 is synthetic. The pinned layer 310 thus includes ferromagnetic layers 312 and 316 separated by a nonmagnetic layer 314, which is preferably Ru. The nonmagnetic layer 314 is configured such that the ferromagnetic layers 312 and 316 are antiferromagnetically aligned. Furthermore, the magnetic element 300 is configured such that the ferromagnetic layer 316 and the pinned layer 350 are antiparallel. As a result, the spin valve portion 304 and the spin tunneling junction portion 302 can both contribute to the spin transfer used to write to the magnetic element 300. Thus, an even lower switching current can be used to write to the magnetic element 300. In addition, because adjacent layers 312 and 350 have their magnetizations aligned parallel, the AFM layers 306 and 360 can be aligned in the same direction. The AFM layers 306 and 360 can, therefore, be aligned in the same step. Thus, processing is further simplified.

Figure 5B:
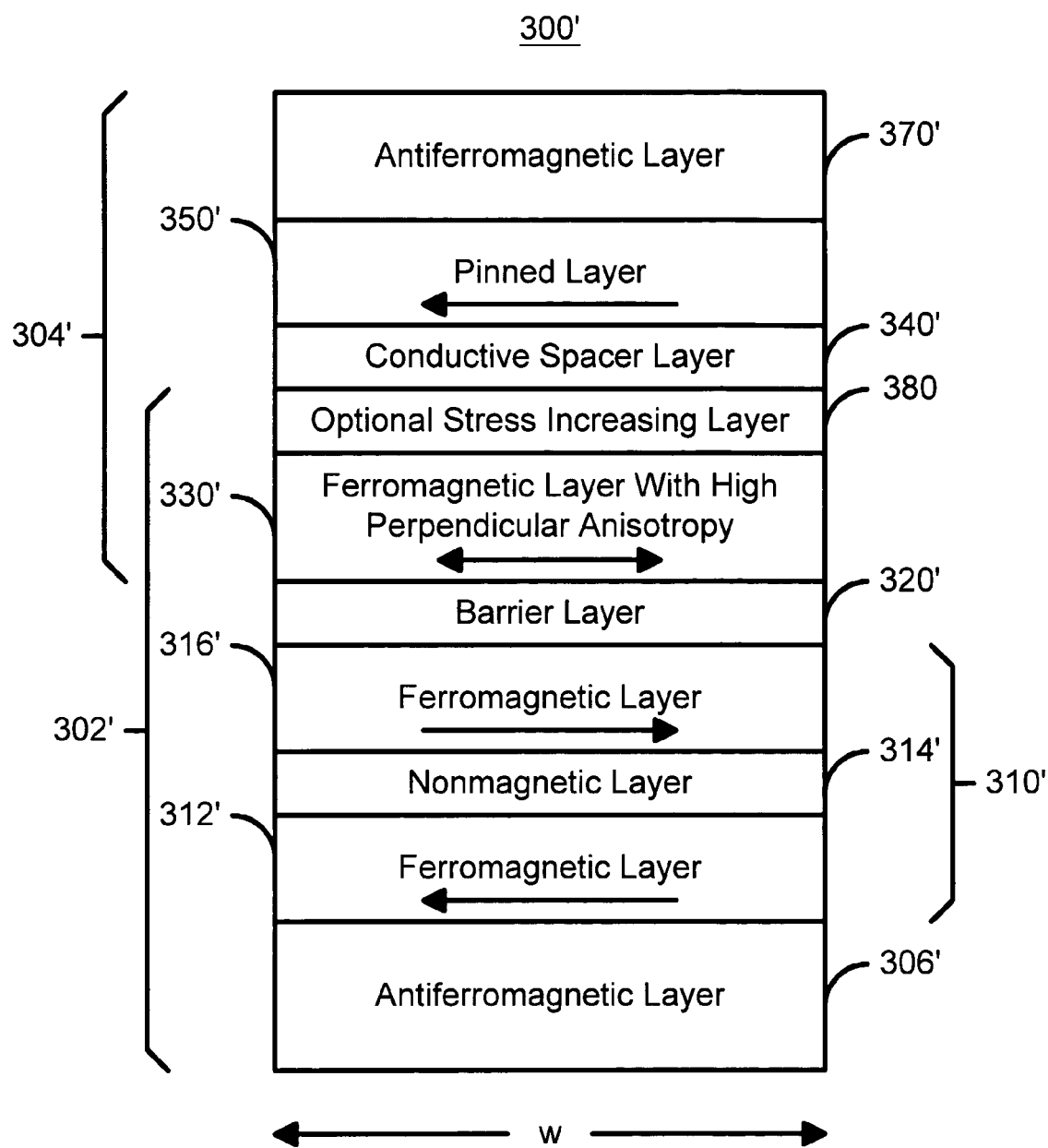
FIG. 5B depicts a second version of the second embodiment of a portion of a magnetic element in accordance with the present invention having a reduced write current density for spin transfer switching due to high perpendicular anisotropy.

The free layers 230 and 330, as well as the magnetic elements 200 and 300, can be configured in an analogous manner to that discussed above. For example, FIG. 5B depicts another version of the second embodiment 300' of a portion of a magnetic element in accordance with the present invention having a reduced write current density for spin transfer due to at least a high perpendicular anisotropy. The magnetic element 300' is analogous to the magnetic element 300 and, therefore, shares its advantages. For example, the free layer 330' has a high perpendicular anisotropy. Furthermore, in a manner similar to the magnetic element 100", the magnetic element 300' includes stress increasing layer 380 that is analogous to the stress increasing layer 154. Although only the stress increasing layer 380 is depicted, another stress increasing layer could be used between the free layer 330' and the barrier layer 320'. However, such a layer would strongly reduce the tunneling magnetoresistance because this layer would lie adjacent to the barrier layer 320'. With the use of the stress increasing layer 380 and/or, in an alternate embodiment, a stress increasing layer between the free layer 330' and the barrier layer 320', the high perpendicular anisotropy of the free layer 330' may be obtained. Thus, the benefits of the magnetic element 100" may also be achieved.

Figure 5C:
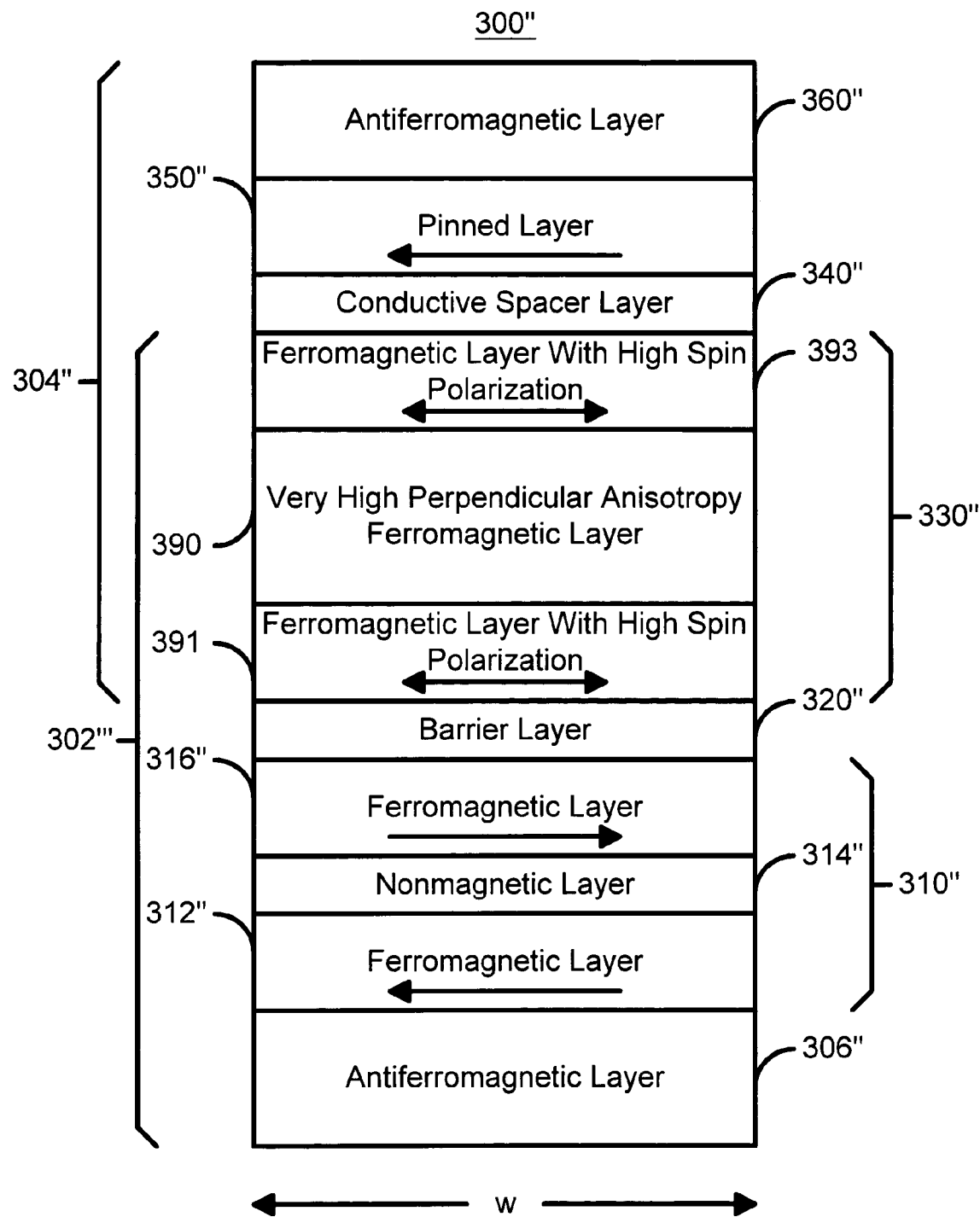
FIG. 5C depicts a third version of the second embodiment of a portion of a magnetic element in accordance with the present invention having a reduced write current density for spin transfer switching due to high perpendicular anisotropy.

FIG. 5C depicts a third version of the second embodiment of a portion of a magnetic element 300" in accordance with the present invention having a reduced write current density for spin transfer due to at least a high perpendicular anisotropy. The magnetic element 300" is analogous to the magnetic element 300 and, therefore, shares its advantages. For example, the free layer 330" has a high perpendicular anisotropy. Furthermore, in a manner similar to the magnetic element 100'", the magnetic element 300" includes very high perpendicular anisotropy ferromagnetic layer 390 that is preferably analogous to the very high perpendicular anisotropy ferromagnetic layer 160 depicted in FIG. 3B and a high spin polarization ferromagnetic layers 391 and 393 analogous to the high spin polarization layer 162. Thus, the very high perpendicular anisotropy ferromagnetic layer 390 is preferably a rare earth-transition metal alloy. Furthermore, the thicknesses of the very high perpendicular anisotropy ferromagnetic layer 390 and the ferromagnetic layers 391 and 393 are preferably tailored such that the equilibrium magnetizations of the very high perpendicular anisotropy ferromagnetic layer 390 and the ferromagnetic layers 391 and 393 are in plane, as depicted. Thus, the high perpendicular anisotropy of the free layer 330" that is analogous to the free layer 130'" may be achieved. Consequently, the benefits of the magnetic element 100'" may also be attained.

In an alternative embodiment, the very high perpendicular anisotropy ferromagnetic layer 390 can include multilayers [Co/Pd]n/Co, [Co/Pt]n/Co, [CoFe/Pd]n/CoFe, [CoFe/Pt]n/CoFe, [CoCr/Pd]n/CoCr, or [CoCr/Pt]n/CoCr where n is between 1 and 10, Co 3 A to 20A, CoFe 3A to 20A, CoCr 3A to 20A, Pd 10A to 100A, Pt 10 A to 100 A. The repeat number n and the exact thicknesses of Co, CoFe, CoCr, Pd, and Pt are chosen so that the total perpendicular anisotropy energy is between twenty and ninety five percent of the total out-of-plane demagnetization energy of the free layer 330".

Figure 6:
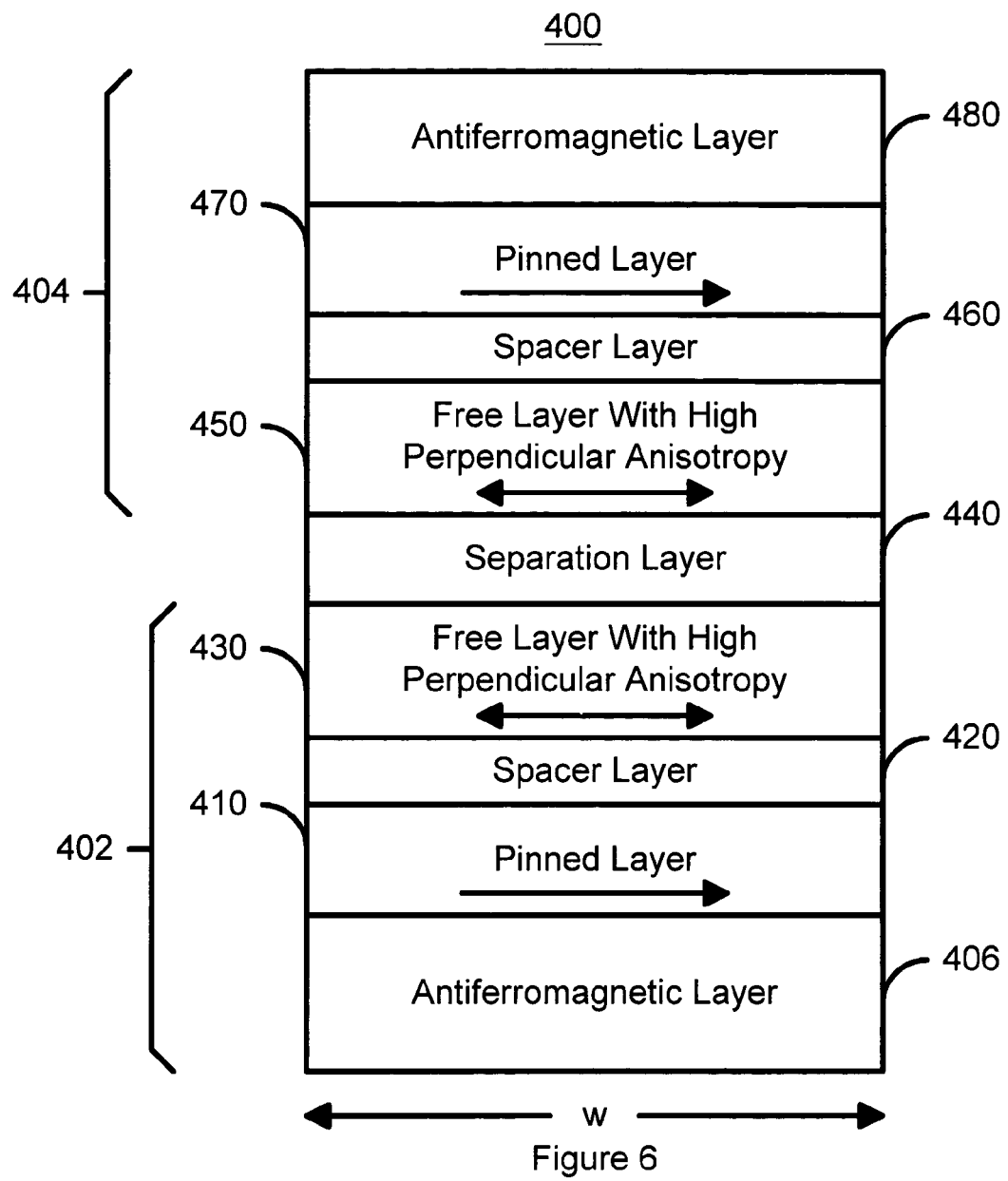
FIG. 6 depicts a third embodiment of a portion of a magnetic element in accordance with the present invention having a reduced write current density for spin transfer switching.

FIG. 6 depicts a third embodiment of a portion of a magnetic element 400 in accordance with the present invention having a reduced write current density for spin transfer. The magnetic element includes two structures 402 and 404, each of which is analogous to the magnetic element 100, 100', 100", and/or 100'". Thus, the structure 402 includes a pinned layer 410, a spacer layer 420, and a free layer 430 that are analogous to, for example, the layers 110, 120, and 130, respectively, of the magnetic element 100. The structure 402 also includes pinning layer 406 that is preferably an AFM layer. Similarly, the structure 404 includes a pinned layer 470, a spacer layer 460, and a free layer 450 that are analogous to, for example, the layers 110, 120, and 130, respectively, of the magnetic element 100. The structure 404 also includes pinning layer 480 that is preferably an AFM layer. One or both of the free layers 430 and 450 have a high perpendicular anisotropy. The free layer 430 and/or 450 may also be synthetic. In such a case the ferromagnetic layers (not explicitly shown) within the free layer 430 and/or 450 would have a high perpendicular anisotropy. Furthermore, the free layers 430 and 450 of the magnetic element 400 are magnetostatically coupled, preferably so that the layers 430 and 450 are antiferromagnetically aligned. In the embodiment shown, the magnetic element 400 includes a separation layer 440. The separation layer 440 is configured to ensure that the free layers 430 and 450 are only magnetostatically coupled. For example, the thickness of the separation layer 440, which is preferably a nonmagnetic conductor, is preferably configured to ensure that the free layers 430 and 450 are antiferromagnetically aligned due to a magnetostatic interaction. In particular, the separation layer 440 serves to randomize the polarization of the spins passing through it. For example, the separation layer 440 includes materials such as Cu, Ag, Au, Pt, Mn, CuPt, CuMn, a Cu/Pt[1–20 A]/Cu sandwich, a Cu/Mn[1–20 A]/Cu sandwich, or a Cu/PtMn[1–20 A]/Cu sandwich. Although the separation layer is used in the magnetic element 400, nothing prevents another mechanism from being used. For example, in one embodiment, the structure 402 might be a dual structure including a second pinned layer (not shown), a second spacer layer (not shown), and a pinning layer (not shown). The thicknesses of the second pinned and spacer layers, as well as the pinning layer may be configured to ensure that the free layers 430 and 450 are magnetostatically coupled.

The free layer 430 and/or the free layer 450 are configured to have a high perpendicular anisotropy, as defined above. Thus, the free layer 430 and/or 450 may correspond to the free layers 130, 130', 130", and/or 130'". Stated differently, the materials and/or properties used in the free layer 430 and/or the free layer 450 are the same as or analogous to those described above with respect to the magnetic elements 100, 100', 100", and 100'". Thus, the magnetic element 400 shares many of the benefits of the magnetic elements 100, 100', 100", and 100'". In particular, the magnetic element can be written using spin transfer at a lower switching current density.

The magnetostatic coupling between the free layers 430 and 450 provides further benefits. Because the free layers 450 and 430 are magnetostatically coupled, a change in magnetization of the free layer 450 is reflected in the free layer 430. The spacer layer 420 can be either a conductive layer or a barrier layer that provides a high signal. Furthermore, because they have separate free layers 450 and 430 the properties of the spin valve 404 and the spin tunneling junction 402, respectively, can be separately tailored to improve their functions of the spin valve and spin tunneling junction, respectively.

Figure 7A:
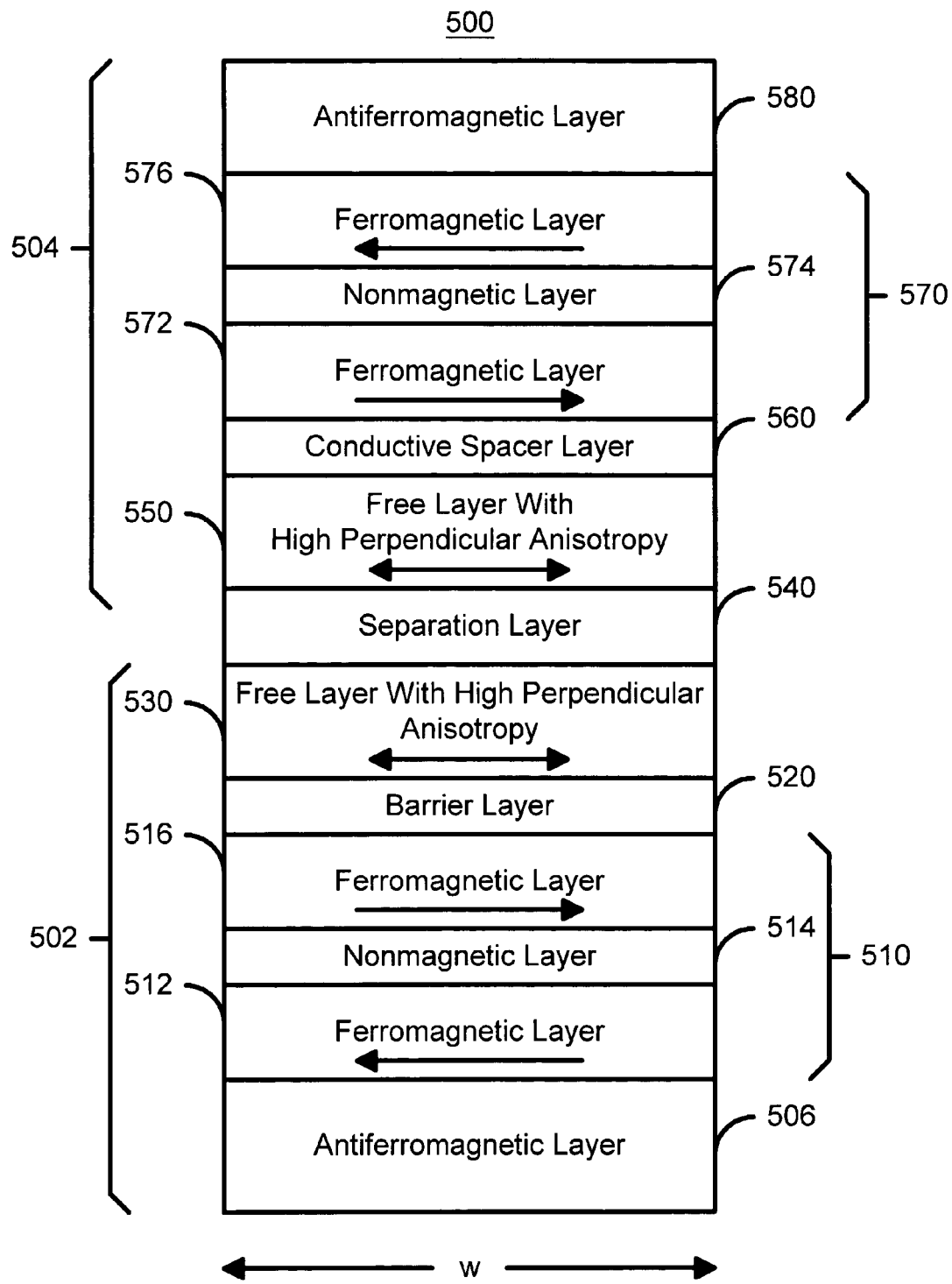
FIG. 7A is a preferred version of the third embodiment of a magnetic element in accordance with the present invention having a reduced write current density for spin transfer switching.

FIG. 7A is a preferred version of the third embodiment of a magnetic element 500 in accordance with the present invention having a reduced write current density for spin transfer. The magnetic element 500 is analogous to the magnetic element 400 depicted in FIG. 6. Thus, analogous components are labeled similarly. Therefore, the magnetic element includes free layers 530 and 550, which corresponds to the free layers 430 and 450, respectively, either or both of which has a high perpendicular anisotropy and both of which are written using spin transfer. The free layer 530 and/or 550 may also be synthetic. In such a case the ferromagnetic layers (not explicitly shown) within the free layer 530 and/or 550 would have a high perpendicular anisotropy. Moreover, the magnetic element 500 preferably utilizes two terminals (not shown) near the top and bottom of the magnetic element. However, nothing prevents the use of another number of terminals, for example a third terminal near the center of the magnetic element 500.

The pinned layers 510 and 570 are synthetic. Thus, the pinned layer 510 includes ferromagnetic layers 512 and 516 separated by a nonmagnetic layer 514 that is preferably Ru. The magnetizations of the ferromagnetic layers 512 and 516 are also aligned antiparallel. Similarly, the pinned layer 570 includes ferromagnetic layers 572 and 576 separated by a nonmagnetic layer 574 that is preferably Ru. The magnetizations of the ferromagnetic layers 572 and 576 are also aligned antiparallel. Furthermore, the spacer layer 520 is preferably a barrier layer that is insulating yet allows electrons to tunnel between the ferromagnetic layer 516 and the free layer 530. The spacer layer 560 is preferably a conductive layer. Thus, the structure 502 is a spin tunneling junction, while the structure 504 is a spin valve.

The free layers 530 and/or 550 are preferably configured in a manner analogous to the free layers 130, 130', 130", 130'", and/or the free layers 430 and 450, respectively. Thus, analogous materials and principles to those discussed above may be used to achieve the high perpendicular anisotropy of the free layers 530 and/or 550. For example, materials having a high crystalline perpendicular anisotropy and/or other conditions such as stress could be used to achieve the high perpendicular anisotropy for the free layer 530 and/or 550. Thus, the materials discussed above with respect to the free layers 130, 130', 130", and 130'" are preferred. In addition, as discussed above with respect to the free layer 130', the free layers 530 and/or 550 can be synthetic. Because of the high perpendicular anisotropy, the magnetic element 500 can be written using spin transfer at a lower switching current density. Stated differently, the magnetic element 500 can share the benefits of the magnetic elements 100, 100', 100", 100'", and/or their combinations.

Furthermore, because the free layers 530 and 550 are magnetostatically coupled, a change in magnetization direction of the free layer 550, for example due to spin transfer induced writing, is reflected in the magnetization of the free layer 530. With the barrier layer 520, the spin tunneling junction 502 provides a high signal. In an alternate embodiment, the barrier layer 520 may be replaced by a conducting layer. However, in such an embodiment, the read signal is decreased for a given read current.

Figure 7B:
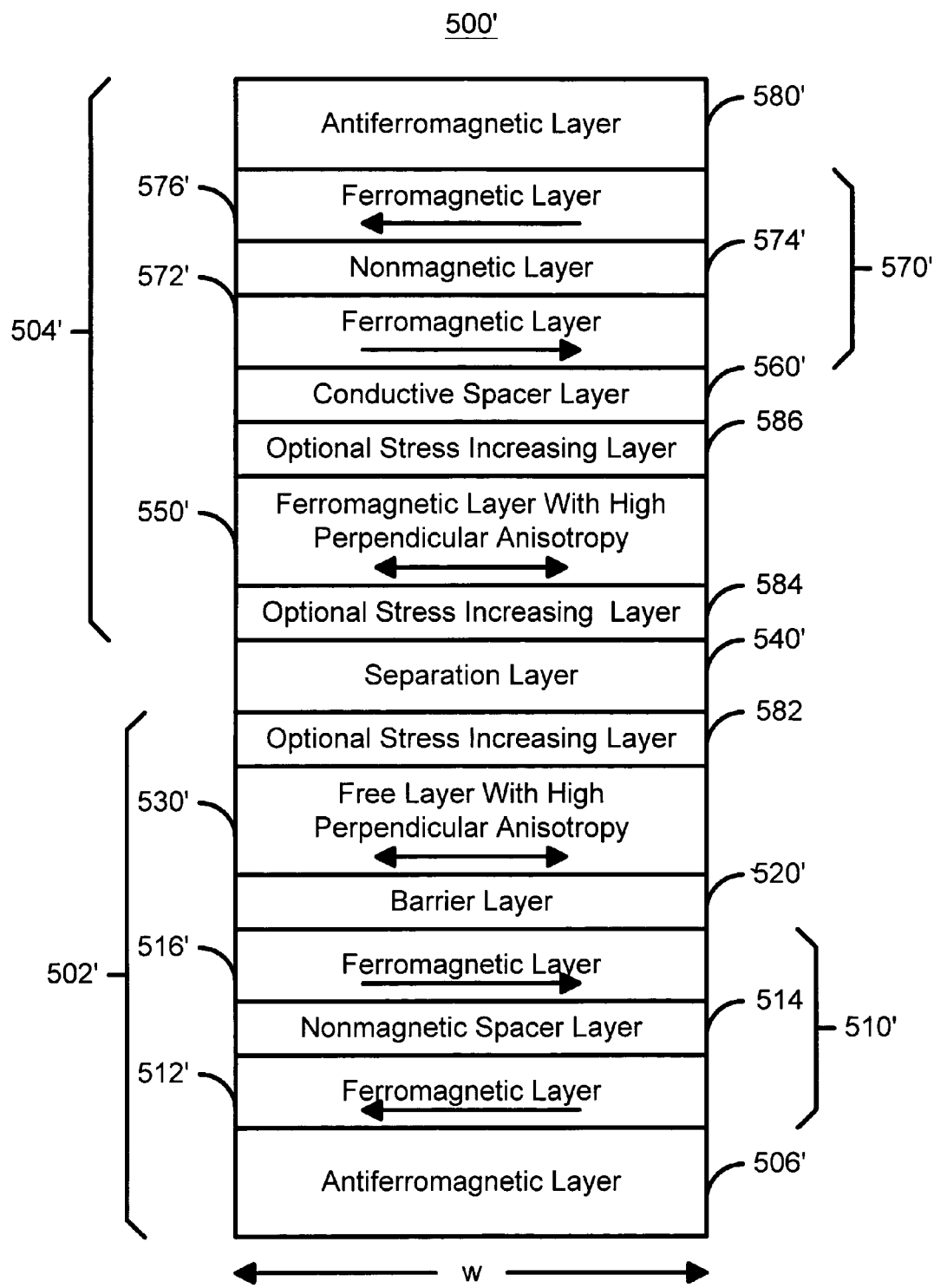
FIG. 7B depicts another version of the third embodiment of a portion of a magnetic element in accordance with the present invention having a reduced write current density for spin transfer switching due to at least high perpendicular anisotropy.

As previously mentioned, the free layers 530 and 550, as well as the magnetic element 500, can be configured in an analogous manner to that discussed above. For example, FIG. 7B is another version of the third embodiment of a magnetic element 500' in accordance with the present invention having a reduced write current density for spin transfer due to at least a high perpendicular anisotropy. The magnetic element 500' is analogous to the magnetic element 500 and, therefore, shares its advantages. For example, the free layers 530' and/or 550' have a high perpendicular anisotropy. Furthermore, in a manner similar to the magnetic element 100", the magnetic element 500' includes optional stress increasing layers 582, 584 and 586 that are analogous to the optional stress increasing layers 152 and 154. The bottom, the top, or both of the optional stress increasing layers 582, 584, and 586 may be used. Although not depicted, an optional stress increasing layer could be placed between the free layer 530' and the barrier layer 520'. However, such an optional stress increasing layer may result in a lower magnetoresistance. In addition, use of the optional stress increasing layer 586 may result in a lower spin torque for spin transfer as well as a lower magnetoresistance for the spin valve 504'. Thus, the high perpendicular anisotropy of the free layer 530' and/or 550' may be obtained. Thus, the benefits of the magnetic element 100" may also be achieved.

Figure 7C:
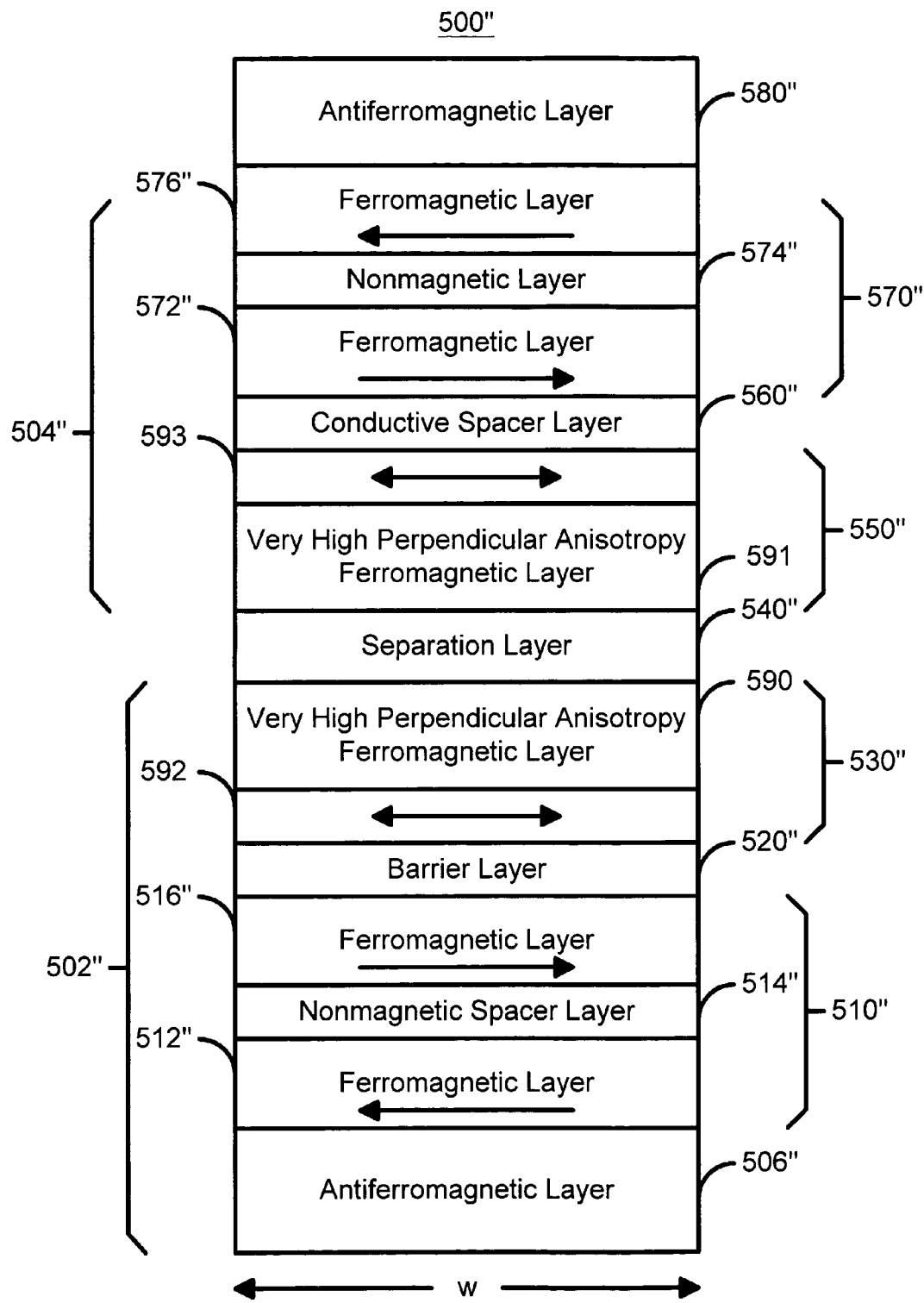
FIG. 7C depicts another version of the third embodiment of a portion of a magnetic element in accordance with the present invention having a reduced write current density for spin transfer switching due to at least high perpendicular anisotropy.

FIG. 7C depicts a third version of the second embodiment of a portion of a magnetic element 500" in accordance with the present invention having a reduced write current density for spin transfer due to a high perpendicular anisotropy. The magnetic element 500" is analogous to the magnetic element 500 and, therefore, shares its advantages. For example, the free layer 530" and/or 550" have a high perpendicular anisotropy. Furthermore, in a manner similar to the magnetic element 100'", the free layer(s) 530" and 550" include very high perpendicular anisotropy ferromagnetic layer(s) 590 and 591, respectively, that are preferably analogous to the very high perpendicular anisotropy ferromagnetic layer 160 depicted in FIG. 3B. The free layer(s) 530" and 550" also include ferromagnetic layers 592 and 593 having a high spin polarization. Additionally, a seed layer, such as AlCu 25 nm, can be optionally inserted between layers 540" and 591 to help enhance the perpendicular anisotropy of layer 591. Furthermore, the thicknesses of the very high perpendicular anisotropy ferromagnetic layer(s) 590 and 591 and the ferromagnetic layer(s) 592 and 593, respectively, are preferably tailored such that the equilibrium magnetizations of the very high perpendicular anisotropy ferromagnetic layer(s) 590 and 591 and the ferromagnetic layer(s) 592 and 593 are in plane, as depicted. Thus, the very high perpendicular anisotropy ferromagnetic layers 590 and 591 are preferably a rare earth-transition metal alloy.

Alternatively, the very high perpendicular anisotropy ferromagnetic layer(s) 590 and 591 can be multilayers [Co/Pd] n/Co, [Co/Pt]n/Co, [CoFe/Pd]n/CoFe, [CoFe/Pt]n/CoFe, [CoCr/Pd]n/CoCr, or [CoCr/Pt]n/CoCr where n is between 1 and 10, Co 3 A to 20 A, CoFe 3 A to 20 A, CoCr 3 A to 20 A, Pd 10A to 100A, Pt 10A to 100A. The repeat number n and the exact thicknesses of Co, CoFe, CoCr, Pd, and Pt are chosen so that the total perpendicular anisotropy energy is between twenty and ninety five percent of the total out-of-plane demagnetization energy of the free layer 530" and/or 550". Thus, the high perpendicular anisotropy of the free layer 530" and/or 550" may be achieved. Consequently, the benefit of the magnetic element 100''' may also be provided.

Thus, the magnetic elements 100, 100', 100", 100''', 200, 300, 300', 300", 400, 500, 500', and 500" can be written using spin transfer at a lower switching current density due to high perpendicular anisotropy and/or low saturation magnetization in at least one free layer. Furthermore, aspects of the magnetic elements 100, 100', 100", 100''', 200, 300, 300', 300", 400, 500, 500', and 500" can be combined to provide further benefits.

Figure 8:
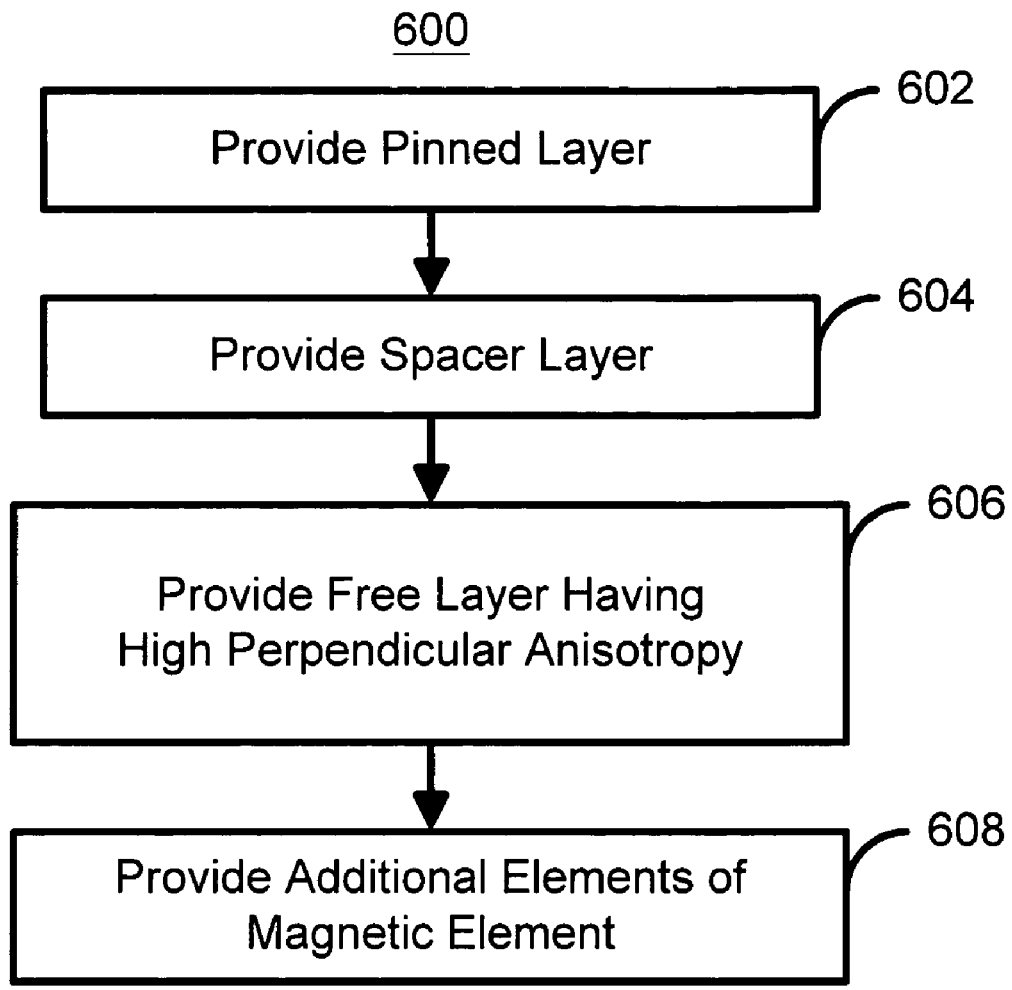
FIG. 8 depicts a flow chart of a one embodiment of a method in accordance with the present invention for providing one embodiment of a magnetic element in accordance with the present invention having a reduced write current density for spin transfer switching.

FIG. 8 depicts a flow chart of a one embodiment of a method 600 in accordance with the present invention for providing one embodiment of a magnetic element in accordance with the present invention having a reduced write current density for spin transfer. The method 600 is described in the context of the magnetic element 100. However, nothing prevents the method 600 from being adapted to provide the magnetic elements 100', 100", 100''', 200, 300, 300', 300", 400, 500, 500', and/or 500". A pinned layer, such as the pinned layer 110 is provided, via step 602. In one embodiment, step 602 includes providing a synthetic pinned layer. The spacer layer 120 is provided, via step 604. Step 604 can include providing a barrier layer or a conducting layer. The free layer 130 having a high perpendicular anisotropy is provided, via step 606. In some embodiments, the very high perpendicular anisotropy ferromagnetic layer or the stress inducing layer may be provided prior to step 606. Step 606 can include providing a synthetic free layer. In such an embodiment, step 606 may also include providing high spin polarization layers between the ferromagnetic layers of the free layer. If the magnetic elements 200, 300, 300', 300", 400, 500, 500', and/or 500" are being provided, additional pinned layers, spacer layers and, in some embodiments, free layers are provided, via step 608. In such embodiments, the free layers may have a high perpendicular anisotropy. Thus, the magnetic elements 100', 100", 100''', 200, 300, 300', 300", 400, 500, 500', and/or 500" may be provided.

A method and system has been disclosed for providing a magnetic element that can be written using spin transfer at a lower switching current density. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
a pinned layer;
a spacer layer, the spacer layer being nonmagnetic; and
a free layer having a free layer magnetization, the spacer layer residing between the pinned layer and the free layer, the free layer having a high perpendicular anisotropy and an out-of-plane demagnetization energy, the high perpendicular anisotropy having a perpendicular anisotropy energy being at least twenty percent and less than one hundred percent of the out-of-plane demagnetization energy;
wherein the magnetic element is configured to allow the free layer magnetization to be switched due to spin transfer when a write current is passed through the magnetic element.

2. A magnetic element comprising:
a first pinned layer;
a spacer layer, the spacer layer being conductive and nonmagnetic;
a free layer having a free layer magnetization, the spacer layer residing between the first pinned layer and the free layer, the free layer having a high perpendicular anisotropy and an out-of-plane demagnetization energy, the high perpendicular anisotropy having a perpendicular anisotropy energy that is less than a one hundred percent of the out-of-plane demagnetization energy;
a barrier layer, the barrier layer being an insulator and having a thickness that allows tunneling through the barrier layer;
a second pinned layer, the barrier layer being between the free layer and the second pinned layer;
wherein the magnetic element is configured to allow the free layer magnetization to be switched due to spin transfer when a write current is passed through the magnetic element.

3. The magnetic element of claim 2 wherein the free layer is a simple free layer.

4. The magnetic element of claim 2 wherein the first pinned layer is a first synthetic pinned layer including a ferromagnetic layer adjacent to the spacer layer, wherein the ferromagnetic layer has a first magnetization and the second pinned layer has a second magnetization and wherein the first magnetization and the second magnetization are oriented in opposite directions.

5. The magnetic element of claim 4 wherein the second pinned layer is a second synthetic pinned layer.

6. The magnetic element of claim 5 wherein the wherein the second synthetic pinned layer includes a second ferromagnetic layer adjacent to the barrier layer, wherein the second ferromagnetic layer has a second magnetization, and wherein the first magnetization and the second magnetization are oriented in opposite directions.

7. The magnetic element of claim 2 wherein the first pinned layer and the second pinned layer are configured such that charge carriers both from the first pinned layer and from the second pinned layer can contribute to switching of the free layer magnetization due to spin transfer.

8. The magnetic element of claim 2 wherein the perpendicular anisotropy energy is at least twenty percent of the out-of-plane demagnetization energy.

9. The magnetic element of claim 8 wherein the perpendicular anisotropy energy less than ninety five percent of the out-of-plane demagnetization energy.

10. The magnetic element of claim 2 wherein the perpendicular anisotropy energy is ninety percent of an out-of-plane demagnetization energy of the free layer.

11. The magnetic element of claim 2 wherein the free layer includes Co, CoCr, CoPt, CoCrPt, CoFe, CoFeCr, CoFePt, and/or CoFeCrPt.

12. The magnetic element of claim 11 wherein an amount of Cr and/or Pt is adjusted such that the perpendicular anisotropy energy is at least twenty percent and less than or equal to ninety five percent of the out-of-plane demagnetization energy of the free layer.

13. The magnetic element of claim 2 further comprising:
a seed layer adjacent to the free layer, the seed layer including Pt, Pd, Cr, Au, Cu, the free layer including Co, CoCr, CoPt, CoCrPt, Fe, CoFe, CoFeCr, CoFePt, and/or CoFeCrPt or a multilayer including Co, CoCr, CoPt, CoCrPt, Fe, CoFe, CoFeCr, CoFePt, and/or CoFeCrPt.

14. The magnetic element of claim 2 wherein the free layer includes Co, CoCr, CoPt, CoCrPt, CoFe, CoFeCr, CoFePt, and/or CoFeCrPt and wherein the magnetic element is configured to include an intrinsic stress of the free layer that provides at least a portion of the high anisotropy of the free layer.

15. The magnetic element of claim 14 further comprising:
a stress increasing layer on the free layer, the stress increasing layer including Cu, Au, Pt, and/or Pt.

16. The magnetic element of claim 2 wherein the free layer further includes:
a very high perpendicular anisotropy ferromagnetic layer; and
a ferromagnetic layer having a high spin polarization, the very high perpendicular anisotropy ferromagnetic layer for ensuring that a combination of the ferromagnetic layer and the very high perpendicular anisotropy ferromagnetic layer have the high perpendicular anisotropy.

17. The magnetic element of claim 16 wherein the very high perpendicular anisotropy ferromagnetic layer includes GdFe and/or GdCoFe.

18. The magnetic element of claim 16 wherein the very high perpendicular anisotropy ferromagnetic layer includes a multilayer of [Co/Pd]n/Co, [Co/Pt]n/Co, [CoFe/Pd]n/CoFe, [CoFe/Pt]n/CoFe, [CoCr/Pd]n/CoCr, or [CoCr/Pt]n/CoCr where n is between 1 and 10, Co 3 A to 20 A, CoFe 3 A to 20 A, CoCr 3 A to 20 A, Pd 10 A to 100 A, Pt 10 A to 100 A.

19. The magnetic element of claim 18 wherein n is selected so that a total perpendicular anisotropy energy of the free layer is between twenty and ninety five percent of the total out-of-plane demagnetization energy.

20. A magnetic element comprising:
a first pinned layer;
a first spacer layer, the first spacer layer being nonmagnetic;
a first free layer, the first spacer layer residing between the first pinned layer and the first free layer, the first free layer having a first out-of-plane demagnetization energy;
a second free layer having a second free layer magnetization, the first free layer and the second free layer being magnetostatically coupled, the second free layer having a second out-of-plane demagnetization energy;
a second spacer layer being nonmagnetic;
a second pinned layer, the second spacer layer residing between the second free layer and the second pinned layer;
wherein the magnetic element is configured to allow the free layer magnetization to be switched due to spin transfer when a write current is passed through the magnetic element; and
wherein the first free layer is configured to have a first high perpendicular anisotropy having a first perpendicular anisotropy energy that is less than one hundred percent of the first out-of-plane demagnetization energy and/or the second free layer is configured to have a second high perpendicular anisotropy that is less than one hundred percent of the second out-of-plane demagnetization energy.

21. The magnetic element of claim 20 further comprising:
a separation layer residing between the first free layer and the second free layer, the separation layer being configured to allow the first free layer and the second free layer to be magnetostatically coupled.

22. The magnetic element of claim 20 wherein the first perpendicular anisotropy energy is at least twenty percent of the first out-of-plane demagnetization energy and/or the second perpendicular anisotropy energy is at least twenty percent of the second out-of-plane demagnetization energy.

23. The magnetic element of claim 22 wherein the first perpendicular anisotropy energy is less than or equal to ninety five percent of the first out-of-plane demagnetization energy and/or the second perpendicular anisotropy energy is less than or equal to ninety five percent of the second out-of-plane demagnetization energy.

24. The magnetic element of claim 22 wherein the first perpendicular anisotropy energy is ninety percent of the first out-of-plane demagnetization energy and/or the second perpendicular anisotropy energy is ninety percent of the second out-of-plane demagnetization energy.

25. The magnetic element of claim 20 wherein the first free layer and/or the second free layer includes Co, CoCr, CoPt, CoCrPt, CoFe, CoFeCr, CoFePt, and/or CoFeCrPt.

26. The magnetic element of claim 25 wherein an amount of Cr and/or Pt is adjusted such that the first high perpendicular anisotropy has a first perpendicular anisotropy energy that is at least twenty percent and less than or equal to ninety five percent of the first out-of-plane demagnetization energy and/or the second high perpendicular anisotropy has a second perpendicular anisotropy energy that is at least twenty percent and less than or equal to ninety five percent of the second out-of-plane demagnetization energy.

27. The magnetic element of claim 20 further comprising:
at least one seed layer adjacent to the first free layer and/or the second free layer, the at least one seed layer including Pt, Pd, Cr, Au, Cu and wherein the first free layer and/or the second free layer includes Co, CoCr, CoPt, CoCrPt, CoFe, CoFeCr, CoFePt, and/or CoFeCrPt or a multilayer including Co, CoCr, CoPt, CoCrPt, Fe, CoFe, CoFeCr, CoFePt, and/or CoFeCrPt.

28. The magnetic element of claim 20 wherein the first free layer and/or the second free layer includes Co, CoCr, CoPt, CoCrPt, CoFe, CoFeCr, CoFePt, CoFeCrPt and wherein the first free layer is configured to include a first intrinsic stress that provides at least a portion of the first high perpendicular anisotropy and/or the second free layer is configured to include a second intrinsic stress that provides at least a portion of the second high perpendicular anisotropy.

29. The magnetic element of claim 20 further comprising at least one stress increasing layer on the first free layer and/or the second free layer, the at least one stress increasing layer including Cu, Au, Pt, and/or Pt.

30. The magnetic element of claim 20 wherein the first free layer and/or the second free layer further include:
a very high perpendicular anisotropy ferromagnetic layer; and
a ferromagnetic layer having a high spin polarization, the very high perpendicular anisotropy ferromagnetic layer for ensuring that a combination of the very high perpendicular anisotropy ferromagnetic layer and the ferromagnetic for the first free layer has the first high perpendicular anisotropy and/or the combination of the of the very high perpendicular anisotropy ferromagnetic layer and the ferromagnetic layer for the second free layer has the second high perpendicular anisotropy.

31. The magnetic element of claim 30 wherein the very high perpendicular anisotropy ferromagnetic layer includes GdFe and/or GdCoFe.

32. The magnetic element of claim 30 wherein the very high perpendicular anisotropy ferromagnetic layer includes a multilayer of [Co/Pd]n/Co, [Co/Pt]n/Co, [CoFe/Pd]n/CoFe, [CoFe/Pt]n/CoFe, [CoCr/Pd]n/CoCr, or [CoCr/Pt]n/CoCr where n is between 1 and 10, Co 3 A to 20 A, CoFe 3 A to 20 A, CoCr 3 A to 20 A, Pd 10 A to 100 A, Pt 10 A to 100 A.

33. The magnetic element of claim 32 wherein n is selected so that the first perpendicular anisotropy energy is between twenty and ninety five percent of the first out-of-plane demagnetization energy and/or the second perpendicular anisotropy energy is between twenty and ninety five percent of the second out-of-plane demagnetization energy.

* * * * *